United States Patent [19]

Elshuber

[11] 3,889,195

[45] June 10, 1975

[54] INTERLOCKED PLURAL CHANNEL SWITCHES AND CONTROLLABLE SWITCH DEVICES FOR USE THEREIN

[75] Inventor: Karl Elshuber, Schnotting near Gemeinde Kirchdorf, Germany

[73] Assignee: Texas Instruments Incorporated, Dallas, Tex.

[22] Filed: Feb. 12, 1973

[21] Appl. No.: 331,411

[52] U.S. Cl. .................................... 325/464; 334/15

[51] Int. Cl. ............................................ H04b 1/16

[58] Field of Search ........... 325/464, 465, 468, 459; 307/221 R, 221 B, 223 R, 223 B; 334/14, 15, 16; 328/39, 42, 43, 50, 51

[56] References Cited

UNITED STATES PATENTS

| | | | |
|---|---|---|---|
| 3,469,110 | 9/1969 | Sherman | 307/223 R |
| 3,656,103 | 4/1972 | Tanaka et al. | 307/223 R |
| 3,708,691 | 1/1973 | Gilbert | 307/223 B |
| 3,740,651 | 6/1973 | Mons | 325/464 |

*Primary Examiner*—Benedict V. Safourek
*Attorney, Agent, or Firm*—Harold Levine; James T. Comfort

[57] ABSTRACT

An interlocked plural channel switch in which both the switching and interlock functions are provided electronically and which can be constructed in integrated circuit form. Selection of any one channel initially disables all of the channels and then enables only the selected channel. Each channel includes a semiconductor controllable switch device connected between supply and reference potential lines common to all the channels. Application of an actuating signal to any one of the controllable switch devices reduces the voltage between the supply and reference potential below a holding voltage necessary to maintain any switch device in a conductive state. Following termination of the actuating signal, only the controllable switch device to which the actuating signal was applied becomes conductive. An example of such a plural channel switch suitable for fabrication as an integrated circuit and utilization thereof in a solid-state channel selector for effecting electronic tuning of a television broadcast receiver are described in detail.

11 Claims, 3 Drawing Figures

PATENTED JUN 10 1975 SHEET 2 3,889,195

PATENTED JUN 10 1975 SHEET 3 3,889,195

INTERLOCKED PLURAL CHANNEL SWITCHES AND CONTROLLABLE SWITCH DEVICES FOR USE THEREIN

The present invention relates to interlocked plural channel switches in which the interlock function is provided electronically and also to semiconductor switch devices suitable for use in such channel switches.

Interlocked plural channel switches are known which incorporate a mechanical interlock function whereby selection of one switch device automatically releases any previously selected switch device, thereby permitting actuation of only one switch at a time. Generally such mechanisms are relatively bulky and incorporate a number of moving parts that must properly cooperate with each other to provide the required interlock function.

The present invention includes a plural channel switch in which both the switching and interlock functions are provided electronically thereby obviating the need for cooperating moving parts to accomplish the interlock function so that the inherent reliability of the switch is improved and the structure thereof simplified and reduced in size. Advantageously, such a plural channel switch may be constructed in solid-state form and may readily be designed in integrated circuit form. In one specific embodiment of the invention, such an interlocked plural channel switch is incorporated in a channel selector for a television broadcast receiver.

The invention also includes an improved semiconductor controllable switch device suitable for use in a plural channel switch and that can be constructed in solid state form.

Accordingly, one aspect of the present invention is an electrical switch having a plurality of channels, each channel including semiconductor controllable switch means switchable between conductive and non-conductive states and semiconductor input means connected to said controllable switch means for selectively applying actuating signals thereto for switching said switch means to said conductive state. The switch means of all said channels are connected in parallel with each other and each of the channels further includes electronic means operable upon application of a said actuating signal to said switch means of that channel, to cause the switch means of any other channel that is in a conductive state to switch to said non-conductive state and to cause switching to said conductive state only of the said switch means to which the actuating signal is applied. Preferably, each controllable switch means includes two transistors having complementary conductivity types, the base of each transistor being connected to the collector of the other transistor to provide a thyristor configuration. The switch means of each channel may have an output terminal connected to a semiconductor output stage for producing an output signal when said switch means is in a conductive state. An interlocked plural channel switch embodying the invention may be used as part of a channel selector for a television broadcast receiver having at least one tuner including tuning means (e.g. a varactor diode) operable by respective tuning control signals to effect tuning of the receiver to a desired broadcoast channel. The plural channel switch includes a plurality of channels corresponding in number with desired broadcast channels to which the tuning means can be tuned. The channel selector also includes means operable under control of the plural channel switch for applying to the tuning means individual tuning control signals corresponding with said plurality of channels of the plural channel switch, for tuning the tuning means to the desired broadcast channels. Actuation of the switch means of any particular channel of the plural channel switch applies an output signal from the output stage of the particular channel to the tuning control signal application means thereby causing application of the said corresponding tuning control signal to operate the tuning means. One suitable tuning control signal application means is described and claimed in my copending U.S. Application Serial Number 308,926 filed Nov. 22, 1972, under the title "Analog Voltage Switch" assigned to the assignee of the present invention.

Preferably, the semiconductor controllable switch means, the semiconductor input means and the semiconductor output means of all the channels comprise circuit elements of a common integrated circuit.

According to another aspect of the present invention, a controllable semiconductor switch device includes a first current flow path connected between a pair of supply terminals and switchable between conductive and non-conductive states, said switching device having a stable conductive state when current flow through the first current flow path is sufficient to maintain a voltage drop between said supply terminals at least equal to a predetermined holding value. The switch device also includes a second current flow path connected in parallel relation with the first current flow path, the second current flow path being switchable by an actuating signal applied thereto between a state of low impedance less than the impedance of said first current flow path when in said conductive state and a state of high impedance substantially greater than that of said first current flow path when in a conductive state. Application of an actuating signal to the second current flow path switches that path to the low impedance state thereby causing the voltage drop across said supply terminals to fall below said holding value and primes the switch device for conduction in said stable state following termination of the actuating signal and return of the voltage across said supply terminals at least to said holding value. A plurality of such switch devices may be connected in parallel across a supply potential line and a reference potential line between which a voltage is supplied at least equal to said holding voltage. Upon application of said actuating signal to the second current flow path of the switch device of a particular channel, that second current flow path is closed causing reduction of the voltage between the supply and reference lines below the said holding value so that the switch device of any channel previously in said stable conductive state changes to a non-conductive state. Following termination of the actuating signal, the second current flow path returns to said high impedance state so that the voltage between the supply and reference lines returns to a value at least equal to said holding value and the switch means to which the actuating signal was applied switches to said stable state of conduction.

Thus in a plural channel switch according to the present invention, an interlock function is provided electronically whereby application of an actuating signal to the switch device of a particular channel, causes switch devices of all channels to become non-conductive and at the same time primes the switch device of the said particular channel to insure that switch alone becomes conductive following termination of the actuating signal.

By way of example, embodiments of the invention will be described in greater detail together with further advantageous features thereof, with reference to the drawings wherein.

Figure 1:
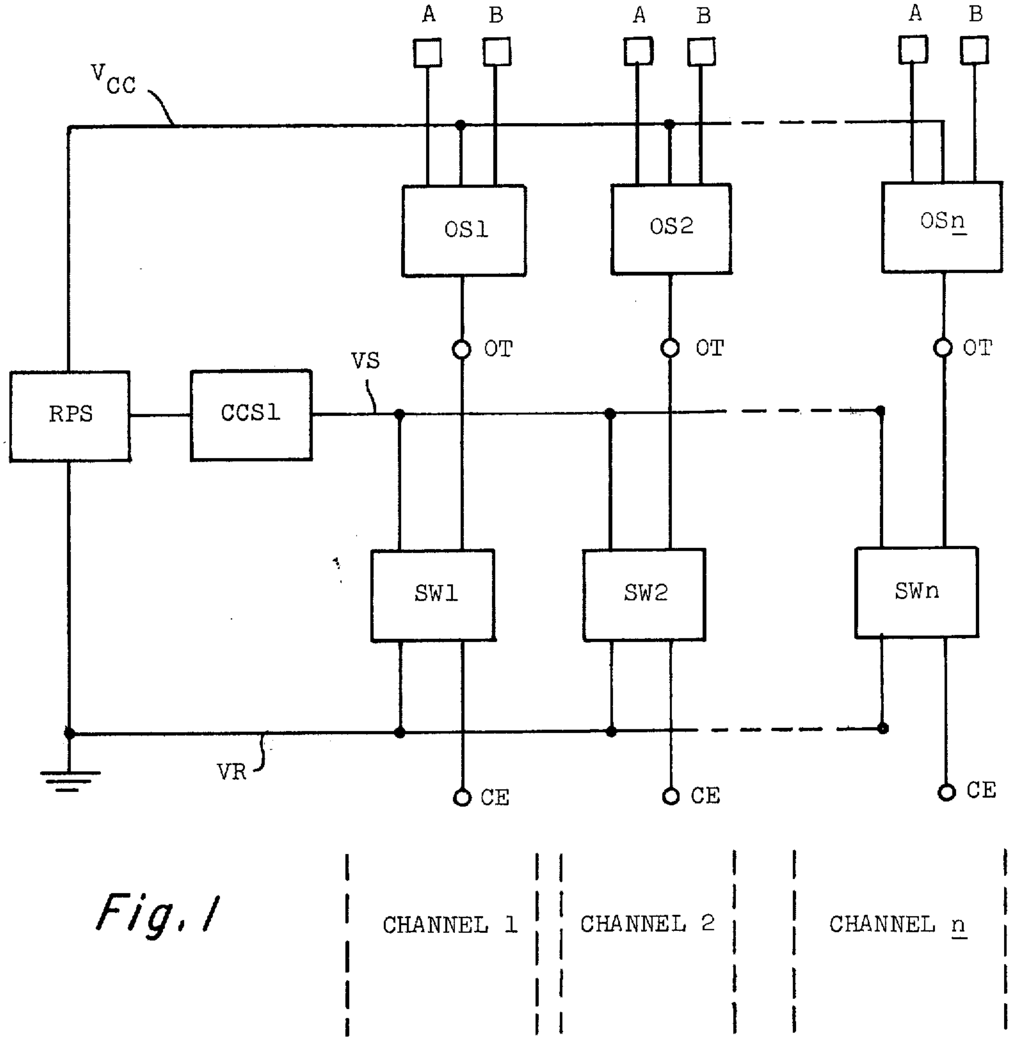
FIG. 1 is a block circuit of an interlocked plural channel switch according to the present invention.

FIG. 1 shows an interlocked channel switch having *n* channels of which CHANNEL 1, CHANNEL 2 and CHANNEL *n* only are illustrated. The channels include individual controllable semiconductor switch devices SW1, SW2 . . . SW*n* switchable between conductive and non-conductive states. Each switch device is connected across a common supply potential line VS and a common reference potential line VR that is connected to ground. The supply potential line VS is connected to a constant current source CCS fed by a regulated power supply RPS powered by an input voltage between a feed potential line V*cc* and the reference potential line VR.

The channel switch is operable to permit only one of the individual switch devices SW1 . . . SW*n* to be in a conductive state at any particular time, switching of one switch device to a conductive state automatically causing any other one of the switch devices in a conductive state to revert to a non-conductive state. Switching of a switch device from a non-conductive to a conductive state is achieved by an input signal temporarily applied to a control electrode CE of the switch device concerned. In the absence of a switching signal applied to the control electrode CE of any of the switch devices, the constant current source CCS1 holds the supply line VS at a potential at least equal to a holding voltage VH sufficient to hold any one of the switch devices in a conductive state, the current available from the constant current source CCS1 being sufficient to feed only one of the switch devices. When an input signal is applied to the control electrode of any switch device, a shunt path through that device is established, causing the voltage between the lines VS and VR to drop below the holding voltage VH whereby any previously conductive switch device reverts to a non-conductive state. Existence of the shunt path primes that switch device so that on termination of the input signal, it commences to conduct, the voltage between the lines VS and VR returning to a value at least equal to the holding voltage VH. Thus, an electronic interlock function is provided whereby application of a switching signal to a selected switch device, firstly disables all of the switch devices and then permits only the selected switch device to become conductive following termination of the switching signal.

In the circuit shown in FIG. 1, each switch device has an output terminal OT connected to control the function of an associated output stage OS1, OS2 . . . OS*n* dependent on the state of conduction of the associated switch device. For example, in the example shown in FIG. 1, when a particular switch device is conductive, the output applied to its associated output stage causes pre-determined potentials to be present at terminals A and B of the output stage concerned. Clearly, modifications of or substitutions for the output stages OS1 . . . OS*n* can be made to provide other desired functions as will be apparent to those skilled in the art e.g. the output stages of OS1 . . . OS*n* might be logic gating circuits.

Figure 2:
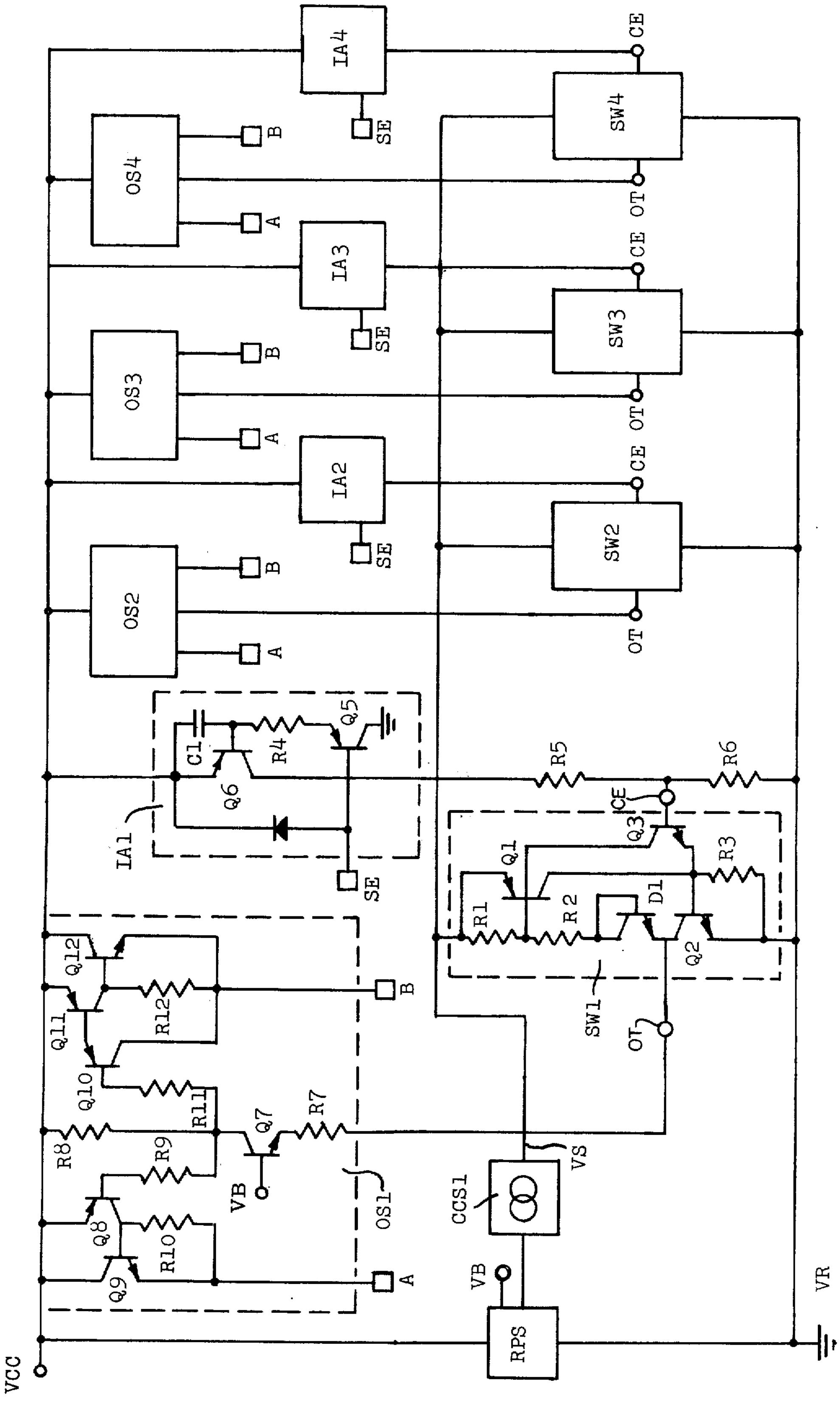
FIG. 2 shows circuit details of a four channel switch embodying the present invention.

FIG. 2 shows a four-channel interlocked switch embodying the invention, the circuit of one channel being shown in detail, and including a preferred form of channel switch device. All the channels incorporate the same circuit design.

Each channel includes a switch device SW1 . . . SW4 controlled by an associated input amplifier IA1 . . . IA4 and feeding on associated output stage OS1 . . . OS4.

The switch device SW1 shown in FIG. 2 includes a PNP transistor Q1 and an NPN transistor Q2 connected in a thyristor configuration. The emitter of transistor Q1 is connected directly to the supply potential line VS and by a resistor R1 to the base of transistor Q1. The base of transistor Q1 is also connected by a resistor R2 in series with a diode D1 (an NPN transistor having a shorted base-collector) to the collector of the transistor Q2. The base of transistor Q2 is connected directly to the collector of transistor Q1 and by a resistor R3 to the emitter of transistor Q2 which is connected to the reference potential line VR. The switch device SW1 also includes an NPN transistor Q3 having a collector connected to the base of transistor Q1 and an emitter connected to the base of transistor Q2. The control electrode CE of the switch device SW1 is connected to the base of transistor Q3 and the output terminal OT is connected to the collector of transistor Q2.

When the switch device SW1 has been switched to a conductive state, the current source CCS1 supplies a current such that the voltage between the lines VS and VR is at least equal to a holding voltage VH sufficient to maintain the switch device in that conductive state. Assume that the constant current source CCS supplies a current I1 to the switch device and that R3>>R1, R2, then the value of the required holding voltage is $$VH = I1.R1 + (I1 + I_{BQ1})\ R2 + V_{FD1} + V_{CEsatQ2}$$

if I1 >>

$$I_{BQ1},\ \text{then}\ I1 \geqq (V_{BEQ1}/R1)$$

and $$VH = I1\ (R1 + R2) + V_{FD1} + V_{CEsatQ1}$$

or $$VH = V_{BEQ1}\ (1 + R2/R1) + V_{FD1} + V_{CEsatQ2} \qquad (A)$$

Equation (A) shows that the ratio R2/R1 determines the holding voltage VH.

Assume now that the switch device SW1 is in a non-conductive state, and it is desired to switch the device to a conductive state. This is achieved by applying an actuating signal from the input amplifier IA1 to the control electrode CE whereby the transistor Q3 is temporarily switched to a saturated condition of conduction. With transistor Q3 saturated, there exists a shunt path between the lines VS and VR through the emitter-base path of transistor Q1 in series with the collector-emitter path of transistor Q3 and the base-emitter path of transistor Q2. The voltage between the lines VS and VR under these conditions is thus reduced to a value: $VH' = V_{BEQ1} + V_{CEsatQ3} + V_{BEQ2}$ In a specific example, VH' = approximately 1.6 volts, and the ratio of R1/R2 is so chosen that VH is about 3.1 volts, i.e.

$$VH' : VH = \text{approximately } 1:2$$

The switch device thus can be considered to have first and second switchable current flow paths. The first path effectively is constituted by resistors R1 and R2, diode D1 and the collector-emitter path of transistor Q2. The second path is in shunt relation with the first path and effectively is constituted by the base-emitter paths of transistors Q1 and Q2 and the collector-emitter path of transistor Q3. The impedance of the second path when switched to an on condition is sufficiently less than the impedance of the first current flow path that the voltage between the lines VS and VR falls below the holding voltage VH.

Thus, with transistor Q3 in a saturated state, the voltage VH' between the lines VS and VR is insufficient to maintain any other switch device across those lines in a conductive state so that any of the other switch devices SW2 . . . SW4 previously in a conductive state, reverts to a non-conductive state. Existence of the shunt path also serves to prime the switch device SW1 so that upon termination of the actuating signal to the base of transistor Q3, the impedance of the shunt path increases and the voltage between the lines VS and VR rises again to a value at least equal to the value VH and the primed switch device SW1 adopts a stable conductive state with current flow through the switch device determined in accordance with Equation (A), all of the other switch devices remaining in a non-conductive state.

The input amplifier IA1 includes two PNP transistors Q5 and Q6, the base of transistor Q5 being connected to the associated channel selection electrode SE. Transistor Q5 has its collector connected to ground while its emitter is connected through resistor R4 to the base of transistor Q6, a capacitor C1 being connected between the emitter and base of transistor Q6. The collector of transistor Q6 has a load comprising resistors R5 and R6 the junction of which is connected to the control electrode CE of the switch device SW1.

Consider the operation of the input amplifier IA1, by way of example, the input amplifiers of the other switch devices operating in like manner. If the channel selection electrode SE is temporarily coupled to ground, e.g., by being touched by a human operator, transistor Q5 commences to conduct feeding an input to the base of transistor Q6 and also charging capacitor C1 of that amplifier. Transistor Q6 amplifies the signal from transistor Q5 causing a rise in potential at the junction of resistors R5 and R6 and hence at the base of transistor Q3 of channel switch device SW1. Transistor Q3 saturates and causes reduction of the voltage between the lines VS and VR to a value of approximately one half of the holding voltage VH required to maintain any of the switch devices SW1 . . . SW4 in a conductive condition as previously described.

When the electrode SE is released, transistor Q5 reverts to a non-conductive state but transistor Q6 remains conductive while capacitor C1 discharges through the base-emitter path of that transistor. As a result, the current flow through transistor Q3 gradually decreases to zero corresponding to increasing impedance of the collector-emitter path of that transistor and the voltage between the lines VS and VR gradually increases back to a value at least equal to the holding voltage VH.

The output terminal OT of the switch device SW1 is connected by a resistor R7 to the emitter of an NPN transistor Q7 the base of which is supplied with a bias potential VB (2.6 volts in the specific example being described) from the regulated power supply RPS. The collector of transistor Q7 is connected through a load resistor R8 to the feedline $V_{CC}$. The collector of transistor Q7 is also connected by resistor R9 to the base of a PNP transistor Q8 the collector of which drives an emitter follower NPN transistor Q9, the emitter of which is connected to the output terminal A. A resistor R10 is connected between the collector of transistor Q8 and the emitter of transistor Q9.

The collector of transistor Q7 is further connected through resistor R11 to the base of a PNP transistor Q10 the emitter of which is connected to the base of a PNP transistor Q11. The collector of transistor Q11 is connected directly to the base of an NPN transistor Q12 and by a resistor R12 to the output terminal B which is also connected to the collector of transistor Q10 and to the emitter of transistor Q12.

When the switch device SW1 is in a non-conductive state, transistor Q7 is biased to a non-conductive state and the output terminals A and B of the output stage OS1 are in a low potential condition. However, when the switch device SW1 is in a conductive state, the base-emitter junction of transistor Q7 is forward biased and the transistor becomes conductive causing forward biasing of the base-emitter junctions of transistors Q8 and Q10 and turn-on of transistors Q9, Q11 and Q12 so that ther terminals A and B of output stage OS1 are switched to high potential conditions. In the specific construction of the output stage described, output terminals A and B each can supply an identical output voltage but the current that can be supplied from terminal B is greater than that available from output terminal A.

The circuit described with reference to FIG. 2 is particularly suitable for construction in monolithic integrated circuit form, including the power supply RPS and the constant current source CCS1 which have not been shown in detail but both of which can be constructed using transistor and resistor circuit elements only, as known in the art. In an integrated circuit embodiment of the circuit of FIG. 2, it is particularly advantageous that the holding voltage for the switch devices SW1 . . . SW4 is determined by the resistor ratio R1:R2 (see equation (A)). Although there may be a relatively wide spread in the absolute values of the resistors R1 and R2 of the several channels in an integrated circuit construction, it is readily possible to maintain the ratio R1:R2 within close limits over a range of operating temperatures so that the value of the holding voltage VH for each switch device also can be held within similar close limits. The diode D1 serves to compensate for changes in holding current caused by changes in temperature so that the holding current is maintained sufficiently constant when the device has been switched to a conductive state, to prevent spurious switching of the device back to a non-conductive state as a result of temperature changes.

The use of a constant current source CCS1 is not essential to the main idea of the present invention but use thereof permits the circuit to be used with a relatively large range of feed voltages $V_{CC}$, e.g., a range of 10 to 20 volts typically may be accommodated.

Figure 3:
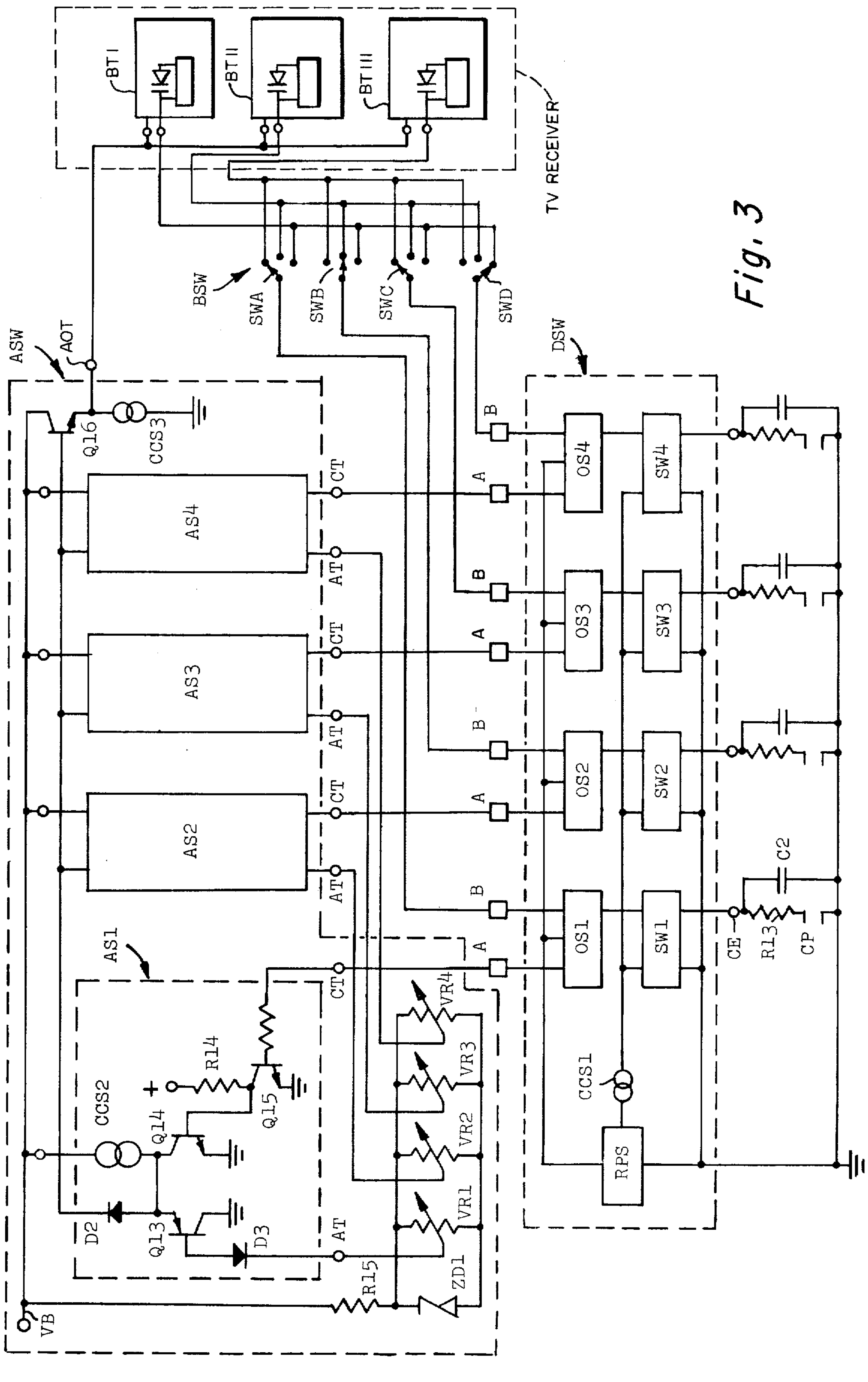
FIG. 3 shows essential circuit details of a channel selector for a television broadcast receiver embodying the present invention.

One specific application of a channel switch embodying the invention, is as part of a channel selector for a tuner of a TV broadcast receiver. A specific example of such a TV channel selector is illustrated in FIG. 3 and includes a digital section DSW comprising a channel switch as shown and described with reference to FIG. 2, and an analog section ASW the circuit and manner of operation of which are described in greater detail in U.S. Patent Application Ser. No. 308,926 (issued as U.S. Pat. No. 3,798,468 on Mar. 19, 1974) filed under the title "Analog Voltage Switch" by Karl Elshuber and assigned to the assignee of the present invention. In FIG. 3, the basic circuit details of a 4-channel selector are shown, the selector being suitable for use in conjunction with a TV broadcast receiver in which tuning is effected electronically by application of a suitable *dc* tuning voltage across a varactor diode in a tuning circuit. For the purpose of the present description, the TV receiver is assumed to include tuners BTI, BTII, and BTIII for three different frequency bands (for example, two VHF bands and one UHF band). Upon actuation of the channel selector to select a particular TV channel, a power supply is connected to the tuner of the frequency band accommodating the selected channel, and an appropriate tuning voltage is applied across the varactor diode of that tuner, as will be explained below.

The control electrodes CE of the controllable switch devices SW1 . . . SW4 of the digital section DSW shown in FIG. 3, each is connected by a resistor R13 to one contact of a contact pair CP, the other contact being connected to ground. A capacitor C2 bridges each contact pair. The output terminals B of the output stages OS1, OS2, OS3 and OS4 are connected respectively to the moving contacts SWA, SWB, SWC and SWD of respective banks of a band selector switch BSW. Each of these banks has three fixed contacts connected to the respective power supply lines for the tuners BTI, BTII, BTIII. Thus, the moving contacts can be programmed to permit selection of the three tuners in any desired manner.

The analog section ASW shown in FIG. 3 includes four channels AS1, AS2, AS3 and AS4 corresponding to the channels of the digital section DSW. The channel AS1 includes a grounded collector PNP transistor Q13 connected by a decoupling diode D2 to the base of an output transistor Q16 common to each of the channels AS1 . . . AS4, and by a diode D3 to an analog voltage input terminal AT. A constant current source CCS2 is connected between a power supply line VB and the collector of transistor Q14 which is also connected to the emitter of transistor Q13. Transistor Q14 is biased to a conductive state through resistor R14, thereby holding the emitter of transistor Q13 close to ground so that no input is supplied to the base of output transistor Q16. An NPN inverter transistor Q15, receives control signals from a terminal CT which turns transistor Q15 on and thereby turns transistor Q14 off.

The channels AS2, AS3 and AS4 each has the same circuit as the channel AS1 and are connected to the supply line VB and to the base output transistor Q16 in like manner.

The analog voltage terminal AT of each of the channels AS1 . . . AS4, is connected to the slider of a respective potentiometer VR1, VR2, VR3, and VR4; a constant voltage is developed across the potentiometers by a parallel connected zener diode ZD1 connected to the supply line VB by a resistor R15. By adjusting the positions of the sliders of the potentiometers VR1 . . . VR4, desired voltages can be applied to the analog voltage terminals AT of the respective channels AS1 . . . AS4.

The emitter of the output transistor Q16 is connected to ground by a constant current source CCS3 and to an output terminal AOT which, in use of the channel selector, is connected to the varactor tuning diodes of the tuners BTI, BTII, BTIII.

The output terminal A of each of the output stages OS1 . . . OS4 of the digital section DSW is connected to the corresponding control terminal CT of the respective channels AS1 . . . AS4 of the analog section ASW.

The constant current sources CCS2 and CCS3 may be formed by transistors and resistors and the channels AS1 . . . AS4 together with the output transistor Q16 and the constant current source CCS3 may be formed on a monolithic integrated circuit.

The channel selector shown in FIG. 3 is operated as follows: The moving contacts SW1 . . . SWD of the band switch BSW are set so that the output terminals B of channels SW1 . . . SW4 are connected with the power supply lines of desired ones of the tuners BTI, BTII, BTIII. For example, FIG. 3 shows the terminals B of the output stages OS1, OS2, OS3 and OS4 connected to the power supply lines of tuners BTIII, BTII, BTIII, and BTI, respectively. The potentiometers VR1 . . . VR4 for the analog section ASW, each is set to a predetermined voltage corresponding to the tuning voltage required to be applied to the varactor diode for selection of the desired channel in the frequency band concerned.

To tune the TV receiver to a particular channel, the user of the receiver touches and bridges the contact pair CP of one of the channel switches SW1 . . . SW4 corresponding with the TV channel concerned. Assume that the contact pair CP of the switch SW1 is bridged. As explained with reference to FIG. 2, this results in each of the switch devices SW1 . . . SW4 initially being switched to a non-conductive state, following which switch device SW1 alone is switched to a conductive state.

Terminal B of output stage OS1 then is in a high potential condition and feeds a power supply voltage to the moving contact SWA of the band selector switch BSW and hence to the tuner BTIII. Terminal A of the output stage OS1 also is switched to a high potential condition which is inverted by transistor Q13 of channel AS1 and fed to the base of transistor Q14, thereby switching that transistor to a non-conductive state from the conductive state in which it had previously been held by the positive bias applied through resistor R14. The emitter of transistor Q13 consequently rises from a value just above ground potential to a value determined by the setting of the slider of potentiometer VR1 whereby transistor Q16 conducts and the analog of the voltage applied to the terminal AT of channel AS1 appears at the output terminal AOT and is applied across the varactor diode of the tuner BTIII whereby the desired channel in the frequency band of that tuner is selected. It will be appreciated that the voltage at the output terminal AOT also is applied to the varactor diodes of the other tuners BTI, and BTII but is ineffective to operate those tuners since they do not receive power supplies from the output stages OS2 . . . OS4, the terminals B of which all are in a low potential condition.

The moving contacts SWA . . . SWD of the bandswitch BSW may be set so that the switch devices SW1 . . . SW4 of the digital section BSW are associated with any desired ones of the tuners BTI, BTII and BTIII and also the potentiometers VR1 . . . VR4 can be set so that the voltages applied to the varactor diodes VAR of the tuners correspond with the selection of any desired combination of channels within these bands.

Although a TV channel selector having four channels has been described with reference to FIG. 3, additional channels could readily be added in the digital section DSW and the analog section ASW with corresponding addition of further potentiometers VR and banks of the band selection switch BSW as required.

When the sections DSW and ASW are constructed in integrated circuit form, the necessary number of channels may, within practicable limits, be incorporated in a single chip or, if more convenient, two or more chips each accommodating a convenient number of channels, may be interconnected with each other to form each section.

It is to be appreciated that further modifications of the embodiments of the invention described above together with other embodiments, will be apparent to those skilled in the art within the scope of the appended claims.

What is claimed is:

1. A plural channel interlocked semiconductor switch including first and second energization potential supply lines, and current source means connected to said supply lines; each said channel including a controllable semiconductor switch device of the latching type switchable between ON and OFF conditions, each said switch device having:

a. first and second supply terminals connected to respective ones of said energization potential supply lines;

b. a first transistor;

c. second and third transistors having conductivity types complementary to said first transistor;

d. means defining a first switchable electrical current flow path between said first and second terminals, said means including the base-emitter path of the first transistor, the collector-emitter path of said third transistor and the base-emitter path of said second transistor;

e. means defining a second switchable electrical current flow path between said first and second terminals, said means including the base-emitter path of the first transistor, the collector-emitter path of said second transistor and direct current impedance means, such that current flow from said current source through said second current flow path establishing at least a predetermined holding voltage between said first and second terminals corresponds to said ON condition of said switch device;

means for selectively applying actuating signals to the bases of said third transistors of said plurality of switch devices such that the third transistor of a selected switch device to which an actuating signal is applied becomes conductive and switches current flow from said current source through the first current flow path of said selected switch device to establish a voltage drop between said supply lines lower than said predetermined value for ensuring that all of said plurality of switch devices are in said OFF condition, said current flow through said first current flow path forward biasing the base-emitter junctions of the first and second transistors of said selected switch device to switch current flow from said current source through said second current flow path of said selected switch device to latch said switch device in said ON condition upon removal of said actuating signal;

and wherein each said channel includes a transistor output amplifier connected to said switch device of said channel for producing at least one output signal when said switch device is in said ON condition.

2. A plural channel switch according to claim 1 wherein said means for selectively applying said actuating signals includes for each said channel, a transistor input amplifier having an output connected to supply said actuating signal to the base of the third transistor of said selected switch device.

3. A plural channel switch according to claim 2, wherein each of said input amplifiers comprises fourth and fifth transistors said fourth transistor of said input amplifier having an emitter connected to supply an input to the base of said fifth transistor of said input amplifier, and said fifth transistors having collectors connected to respectively to the bases of the third transistors of said switch devices.

4. A plural channel switch according to claim 3, wherein each of said input amplifiers further includes charge storage means connected in parallel with the base-emitter path of said fifth transistor of said input amplifier, and said fourth transistor of said input amplifier being responsive to a temporary coupling to ground to feed said input signal to said fifth transistor and to charge said charge storage means whereby said fifth transistor supplies said signal to the base of said third transistor for a predetermined time period under control of said charge storage means to assist latching of said selected switch device to said ON condition.

5. A plural channel switch device according to claim 3, wherein said semiconductor switch devices and said input and output amplifiers of all said channels comprise circuit elements of a monolithic integrated circuit.

6. In a television broadcast receiver having at least two tuners each including tuning means operable under control of respective electrical tuning control signals to effect tuning of said receiver to a desired broadcast channel, each of said tuners including a power supply line, the combination of:

an electrical switch according to claim 1, including a plurality of channels corresponding in number with desired broadcast channels to which said tuners can be tuned, wherein said output amplifier of each said channel is adapted to produce first and second output signals when said switch device of that channel is in said ON condition, means operable under control of said first output signals from said channel output amplifiers for producing individual tuning control signals corresponding with said plurality of channels of said electrical switch for tuning and tuning means to said desired channels; and connection means having a plurality of channels corresponding with the plurality of channels of said electrical switch, said connection means connecting said channel output amplifiers selectively with the power supply line of a respective one of said tuners to supply said second output signals from said output amplifiers to the power supply lines of said tuners;

actuation of said switch device of any particular channel of said electrical switch to said ON condition, i. applying said first output signal from the output amplifier of said particular channel to said tuning control signal application means causing application of said corresponding tuning control signal to the tuning means of said two tuners; and ii. applying said second output signal from the output amplifier of said particular channel over the corresponding channel of said connection means to provide a power supply only for the tuner connected to that channel of said connection means;

only the tuning means of the tuner that receives both said power supply and said tuning control signal being operated.

7. A plural channel interlocked semiconductor switch including an energization potential supply line and a reference potential line common to each of said channels, and current supply means connected to said supply potential line; each said channel including a controllable semiconductor switch device of the latching type switchable between ON and OFF conditions, and a transistor output amplifier connected to the switch device of said channel for producing at least one output signal when said switch device is in said ON condition, each said switch device having:

a. supply terminals connected respectively to said energization potential supply line and said reference potential line;

b. a first transistor having an emitter connected to a first one of said supply terminals and a first resistive path connecting the emitter and base of said first transistor;

c. second and third transistors having conductivity types complementary to said first transistor; the base of said first transistor connected by a second resistive path to the collector of said second transistor and the collector of said first transistor connected to the base of the second transistor;

the emitter of the second transistor connected to the other one of said supply terminals; said third transistor having a collector-emitter path connected between the bases of said first and second transistors so that the direction of the emitter-collector current flow path of said third transistor is the same as the forward directions of the base-emitter path of said first and second transistors;

means for selectively applying actuating signals to the bases of said third transistors of said plurality of switch devices such that the third transistor of a selected switch device to which an actuating signal is applied becomes conductive and switches current flow from said current source in a forward direction through the base-emitter paths of the first and second transistors and through the collector-emitter path of the third transistor of said selected switch device to establish a voltage drop between said supply lines lower than a predetermined value for ensuring that all of said plurality of switch devices are in said OFF condition, termination of said actuating signal establishing current flow from said current source in a forward direction through the base-emitter path of the first transistor and the collector-emitter path of the second transistor of said selected switch device to latch said switch device in said ON condition 8. A switch device according to claim 7 wherein said second resistive path comprises a fixed resistor connected to the base of the first transistor and a diode connected to the collector of said second transistor, said diode being poled in the same direction as the current flow direction of the collector-emitter path of the second transistor to reduce changes in current flow between said supply terminals when said switch device is in said ON condition.

9. A switch device according to claim 7, wherein the first and second resistive paths each comprises a fixed resistor, and wherein the fixed resistor of the second resistive path is about twice as great as the value of the resistor of the first resistive path.

10. A controllable semiconductor switch according to claim 7, further comprising an input amplifier including charge storage means; said amplifier responsive to a temporary input signal thereto to apply said actuating signal to the base of said third transistor, and to charge said charge storage means; upon termination of said temporary input signal, said charge storage means discharging to maintain application of said actuating signal to the base of said third transistor for a predetermined time period.

11. A plural channel interlocked semiconductor switch including first and second energization potential supply lines and electric current source means connected to said supply lines; each said channel including:

a. a controllable semiconductor switch device of the latching type switchable between ON and OFF conditions, and having supply terminals connected to respective ones of said energization potential supply lines, a control terminal, and an output terminal;

b. said switch device adapted to have first and second conductive states such that current flow from said current source through said switch device when in said first conductive state establishes a voltage drop between said supply lines lower than a predetermined holding voltage when said switch device is in said second conductive state corresponding to said ON condition;

c. means for selectively applying actuating signals to the control terminals of said switch devices to switch a selected switch device to said first conductive state initially to establish a voltage drop between said supply line lower than said predetermined holding voltage and upon termination of said actuating signal to latch said selected switch device in said second conductive state;

d. and wherein the output terminal of each switch device is connected to the input of a respective transistor amplifier for producing an output signal when said switch device is in said ON condition.

* * * * *